United States Patent [19]
Hoffman et al.

[11] Patent Number: 5,846,387
[45] Date of Patent: *Dec. 8, 1998

[54] ON-SITE MANUFACTURE OF ULTRA-HIGH-PURITY HYDROCHLORIC ACID FOR SEMICONDUCTOR PROCESSING

[75] Inventors: Joe G. Hoffman, Cardiff; R. Scot Clark, Fallbrook, both of Calif.

[73] Assignee: Air Liquide Electronics Chemicals & Services, Inc., Houston, Tex.

[ * ] Notice: The term of this patent shall not extend beyond the expiration date of Pat. No. 5,496,778.

[21] Appl. No.: 673,579

[22] Filed: Jul. 1, 1996

Related U.S. Application Data

[63] Continuation-in-part of Ser. No. 610,261, Mar. 4, 1996, Pat. No. 5,755,934, which is a continuation of Ser. No. 179,001, Jan. 7, 1994, Pat. No. 5,496,778 and a continuation-in-part of PCT/US95/07649, Jun. 5, 1995 and a continuation-in-part of PCT/US96/09555, Jun. 5, 1996.

[60] Provisional application No. 60/038,712, Jul. 7, 1995.

[51] Int. Cl.⁶ ............................. B01D 3/00; B01D 45/00; C01B 7/19
[52] U.S. Cl. ............................. 203/40; 203/43; 203/61; 202/158; 202/168; 202/181; 202/182; 202/185.1; 423/483; 423/484; 134/10
[58] Field of Search ................................. 203/40, 43, 61; 202/158, 168, 181, 182, 185.1; 423/483, 484; 134/10

[56] References Cited

U.S. PATENT DOCUMENTS

| | | |
|---|---|---|
| 4,756,899 | 7/1988 | Jenczewski et al. .................... 423/483 |
| 4,828,660 | 5/1989 | Clark et al. ............................... 204/82 |
| 4,892,625 | 1/1990 | Shimizu et al. ......................... 203/86 |
| 4,929,435 | 5/1990 | Boghean et al. ........................ 423/484 |
| 4,952,386 | 8/1990 | Davison et al. ........................ 423/484 |
| 4,980,032 | 12/1990 | Dobson et al. ............................ 203/40 |
| 5,164,049 | 11/1992 | Clark et al. ................................ 203/40 |
| 5,288,333 | 2/1994 | Tanaka et al. ............................. 134/31 |
| 5,346,557 | 9/1994 | Ito et al. .................................... 134/10 |
| 5,362,469 | 11/1994 | Seseke-Koyro et al. ................. 203/10 |
| 5,496,778 | 3/1996 | Hoffman et al. ........................ 437/250 |
| 5,500,095 | 3/1996 | Shinagawa et al. ........................ 203/2 |
| 5,500,098 | 3/1996 | Brown et al. .............................. 203/13 |

FOREIGN PATENT DOCUMENTS

| | | |
|---|---|---|
| 63152603 | 3/1987 | Japan . |
| 62-213127 | 9/1987 | Japan . |
| 63-283027 | 11/1988 | Japan . |
| 6434407 | 2/1989 | Japan . |
| 62253772 | 4/1989 | Japan . |
| 62264280 | 4/1989 | Japan . |

*Primary Examiner*—Nina Bhat
*Attorney, Agent, or Firm*—Burns, Doane, Swecker & Mathis, L.L.P.

[57] ABSTRACT

Highly purified HCl for use in semiconductor manufacturing is prepared on-site by drawing HCl vapor from a liquid HCl reservoir, and scrubbing the filtered vapor in a low-pH aqueous scrubber.

40 Claims, 3 Drawing Sheets

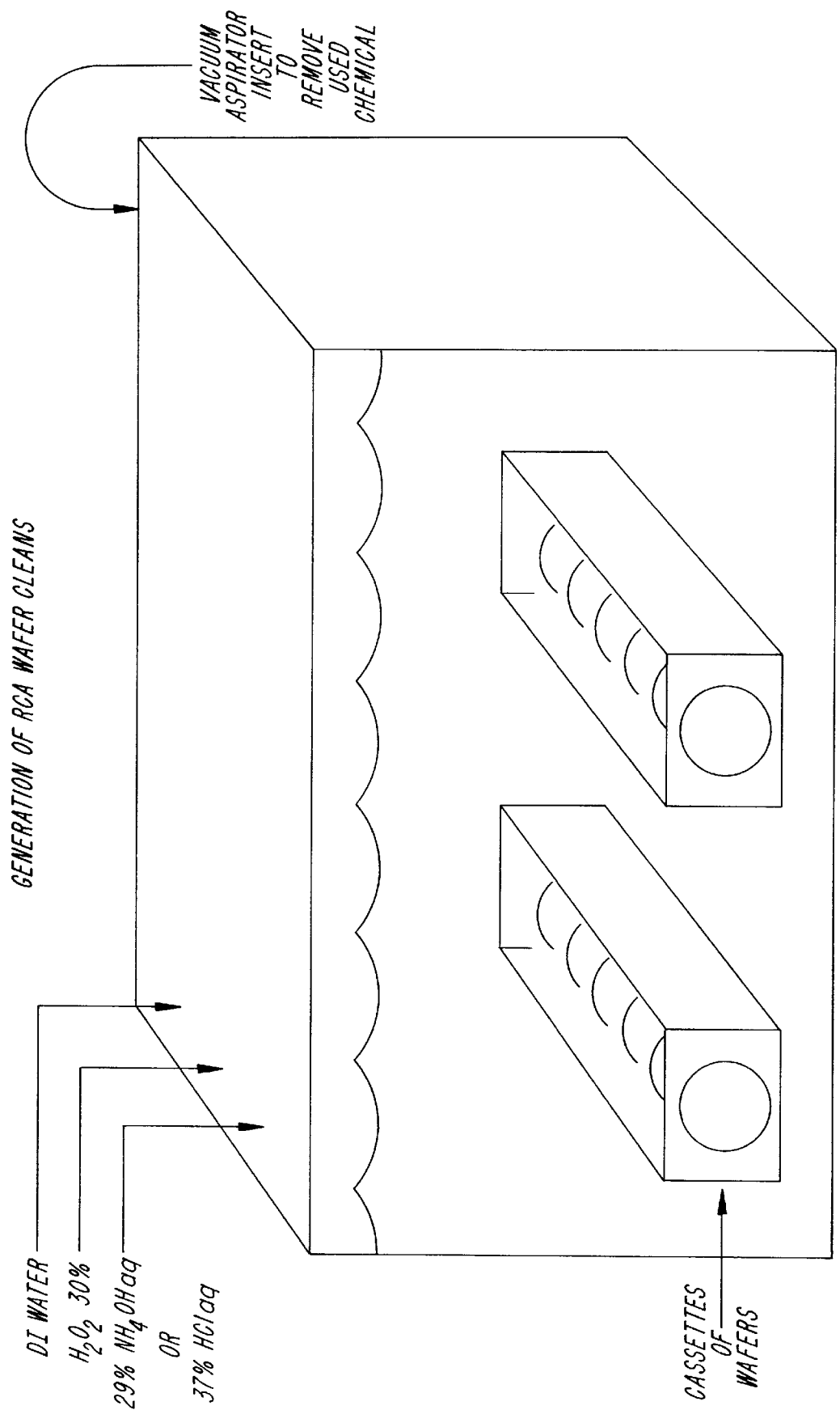

ON-SITE MANUFACTURE OF ULTRA-HIGH-PURITY HYDROCHLORIC ACID FOR SEMICONDUCTOR PROCESSING

CROSS-REFERENCE TO RELATED APPLICATIONS

This application is a continuation-in-part of application Ser. No. 08/610,261, filed Mar. 4, 1996, now U.S. Pat. No. 5,755,934 which is a continuation of application Ser. No. 08/179,001, filed Jan. 7, 1994, now U.S. Pat. No. 5,496,778. This application is also a continuation-in-part of PCT Application Nos. PCT/US96/09555, filed Jun. 5, 1996, and of PCT/US95/07649, filed Jun. 5, 1995. The present application also claims benefit of priority of U.S. Provisional Application Ser. No. 60/038,712, filed Jul. 7, 1995.

BACKGROUND AND SUMMARY OF THE INVENTION

The present invention relates to systems and methods for supplying ultra-high-purity HCl for semiconductor manufacture.

Contamination is generally an overwhelmingly important concern in integrated circuit manufacturing. A large fraction of the steps in modern integrated circuit manufacturing are cleanup steps of one kind or another; such cleanup steps may need to remove organic contaminants, metallic contaminants, photoresist (or inorganic residues thereof), byproducts of etching, native oxides, etc.

As of 1995 the cost of a new front end (integrated circuit wafer fabrication facility) is typically more than a billion dollars ($1,000,000,000), and a large fraction of this cost is directed to measures for particulate control, cleanup, and contamination control.

One important source of contamination is impurities in the process chemicals. Since the cleanups are so frequent and so critical, contamination due to cleanup chemistry is very undesirable.

One of the long-running technological shifts in semiconductor processing has been the changes (and attempted changes) between dry and wet processing. In dry processing, only gaseous or plasma-phase reactants come in contact with the wafer. In wet processing, a variety of liquid reagents are used for purposes such as etching silicon dioxide or removing native oxide layers, removing organic materials or trace organic contaminants, removing metals or trace organic contaminants, etching silicon nitride, etching silicon.

Plasma etching has many attractive capabilities, but it is not adequate for cleanup. There is simply no available chemistry to remove some of the most undesirable impurities, such as gold. Thus wet cleanup processes are essential to modern semiconductor processing, and are likely to remain so for the foreseeable future.

Plasma etching is performed with photoresist in place, and is not directly followed by high-temperature steps. Instead the resist is stripped, and a cleanup is then necessary.

The materials which the cleanup must remove may include: photoresist residues (organic polymers); sodium; Alkaline earths (e.g. calcium or magnesium); and heavy metals (e.g. gold). Many of these do not form volatile halides, so plasma etching can't carry them away. Cleanups using wet chemistries are required.

The result of this is that purity of process chemicals at plasma etching is not as critical, since these steps are always followed by cleanup steps before high-temperature steps occur, the cleanup steps can remove dangerous contaminants from the surface before high-temperature steps drive in these contaminants. However, purity of the liquid chemicals is much more critical, because the impingement rate at the semiconductor surface is typically a million times higher than in plasma etching, and because the liquid cleanup steps are directly followed by high-temperature steps.

However, wet processing has one major drawback, namely ionic contamination. Integrated circuit structures use only a few dopant species (boron, arsenic, phosphorus, and sometimes antimony) to form the required p-type and n-type doped regions. However, many other species are electrically active dopants, and are highly undesirable contaminants. Many of these contaminants can have deleterious effects, such as increased junction leakage, at concentrations well below $10^{13}$ cm$^{-3}$. Moreover, some of the less desirable contaminants segregate into silicon, i.e. where silicon is in contact with an aqueous solution the equilibrium concentration of the contaminants will be higher in the silicon than in the solution. Moreover, some of the less desirable contaminants have very high diffusion coefficients, so that: introduction of such dopants into any part of the silicon wafer will tend to allow these contaminants to diffuse throughout, including junction locations where these contaminants will cause leakage.

Thus all liquid solutions which will be used on a semiconductor wafer should preferably have extremely low levels of all metal ions. Preferably the concentration of all metals, combined should be less than 300 ppt (parts per trillion), and less than 10 ppt for any one metal, and less would be better. Moreover, contamination by both anions and cations must also be controlled. (Some anions may have adverse effects, e.g. complexed metal ions may reduce to mobile metal atoms or ions in the silicon lattice.)

Front end facilities normally include on-site purification systems for preparation of high-purity water (referred to as "DI" water, i.e. deionized water). However, it is more difficult to obtain process chemicals in the purities needed.

The parent application described a method for preparing ultra-high-purity ammonia, in an on-site system located at the semiconductor wafer production site, by: drawing ammonia vapor from a liquid ammonia reservoir, passing the ammonia vapor through a microfiltration filter, and scrubbing the filtered vapor with high-pH purified water (preferably deionized water which has been allowed to equilibrate with the ammonia stream). This discovery permitted conversion of commercial grade ammonia to ammonia of sufficiently high purity for high-precision manufacturing without the need for conventional column distillation. The drawing of the ammonia vapor from the supply reservoir serves by itself as a single-stage distillation, eliminating nonvolatile and high-boiling impurities, such as alkali and alkaline earth metal oxides, carbonates and hydrides, transition metal halides and hydrides, and high-boiling hydrocarbons and halocarbons. The reactive volatile impurities that could be found in commercial grade ammonia, such as certain transition metal halides, Group III metal hydrides and halides, certain Group IV hydrides and halides, and halogens, previously thought to require distillation for removal, were discovered to be capable of removal by scrubbing to a degree which is adequate for high-precision operations. This is a very surprising discovery, since scrubber technology is traditionally used for the removal of macro-scale, rather than micro-scale, impurities.

The extreme purity levels required by semiconductor manufacturing are rare or unique among industrial processes. At such extreme purity levels, handling of chemicals is inherently undesirable (though of course it cannot be entirely avoided). Exposure of the ultrapure chemical to air (particularly in an environment where workers are also present) must be minimized. Such exposure risks introduction of particulates, and resulting contamination. Shipment of ultrapure chemicals in closed containers is still not ideal, since there is inherently a higher risk of contaminants at the manufacturer or at the user's site. Moreover, undetected contamination may damage an expensively large quantity of wafers.

Since many corrosive and/or toxic chemicals are commonly used in semiconductor processing, the reagent supply locations are commonly separated from the locations where front-end workers are present. Construction and maintenance of piping for ultra-high-purity gasses and liquids are well-understood in the semiconductor industry, so most gasses and liquids can be transported to wafer fabrication stations from anywhere in the same building (or even in the same site).

The present application discloses systems and methods for preparation of ultrapure chemicals on-site at a semiconductor manufacturing facility, so that they can be piped directly to the points of use. The disclosed systems are very compact units which can be located in the same building as a front end (or in an adjacent building), so that handling is avoided.

Hydrochloric Acid

An important family of semiconductor processing chemicals is HCl, in gaseous and aqueous forms. Liquid hydrochloric acid is also widely used in the acid cleanup portion of the standard RCA cleanup.

As noted above, the parent application described methods and systems for preparing ultra-high-purity ammonia. It has now been discovered that a modification of these methods and systems can be used to prepare ultra-high-purity HCl.

The starting material is commercial-grade anhydrous HCl. A first purification step is provided simply by evaporation. (HCl has a vapor pressure of 613 psig at 70° F., and 1185 psig at 124.5° F., so the vapor pressure always provides ample transfer pressure from the bulk storage tank.) Preferably HCl vapor is drawn directly from the tank. (In an alternative embodiment, liquid HCl is transferred in batches from the bulk storage tank, and evaporated in an evaporation chamber under controlled temperature and pressure.)

Hydrochloric Acid Generation

The purified gaseous HCl can now be dissolved in water to produce concentrated hydrochloric acid.

On-Site Preparation of Ultrapure Mixed Cleanup Solutions

The present application discloses preparation of mixed cleanup solutions, such as the RCA acidic cleanup and the RCA basic cleanup, at the site of a wafer fabrication facility, from ingredients which themselves have been ultrapurified at the same site.

The RCA cleanup includes: 1) solvent wash to remove gross organics—in tetrachloroethylene or comparable solvent; 2) basic cleanup—$NH_4OH+H_2O_2+H_2O$; and 3) acid cleanup—$HCl+H_2O_2+H_2O$.) See W. Runyan and K. Bean, SEMICONDUCTOR INTEGRATED CIRCUIT PROCESSING TECHNOLOGY (1990), which is hereby incorporated by reference. For semiconductor manufacturing, such cleanup reagents are normally bought as packaged containers. However, this implies that some handling of the solutions in those containers will be necessary, both at the manufacturer's plant and at the use location. As noted above, such handling of ultra-high purity chemicals is always undesirable.

Various other cleanup chemistries have been proposed. For example, the Shiraki cleanup is an aggressive, pre-epitaxy cleanup, which adds a nitric acid step to the cleanup sequence, and uses somewhat higher temperatures and concentrations. See Ishizaki and Shiraki, "Low Temperature Surface Cleaning of Silicon and its application to Silicon MBE," 133 J. ELECTROCHEM. Soc. 666 (1986), which is hereby incorporated by reference.

The RCA acid cleanup solution is typically $HCl+H_2O_2+H_2O$ in proportions of 1:1:6 or 1:2:8. According to one of the innovative teachings disclosed herein, RCA acid cleanup (or analogous cleanup solutions) is generated at the site of a wafer manufacturing plant, by combination of ultra-pure HCl which has been purified on-site with ultra-pure hydrogen peroxide which has been purified on-site. Thus purity is increased, and the risk of undetected accidental contamination is reduced.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 3 is a block diagram of semiconductor cleanup stations, in a wafer fabrication facility in which the hydrochloric acid purification of FIG. 1 may be incorporated.

DETAILED DESCRIPTION OF THE PREFERRED EMBODIMENTS

Figure 1:
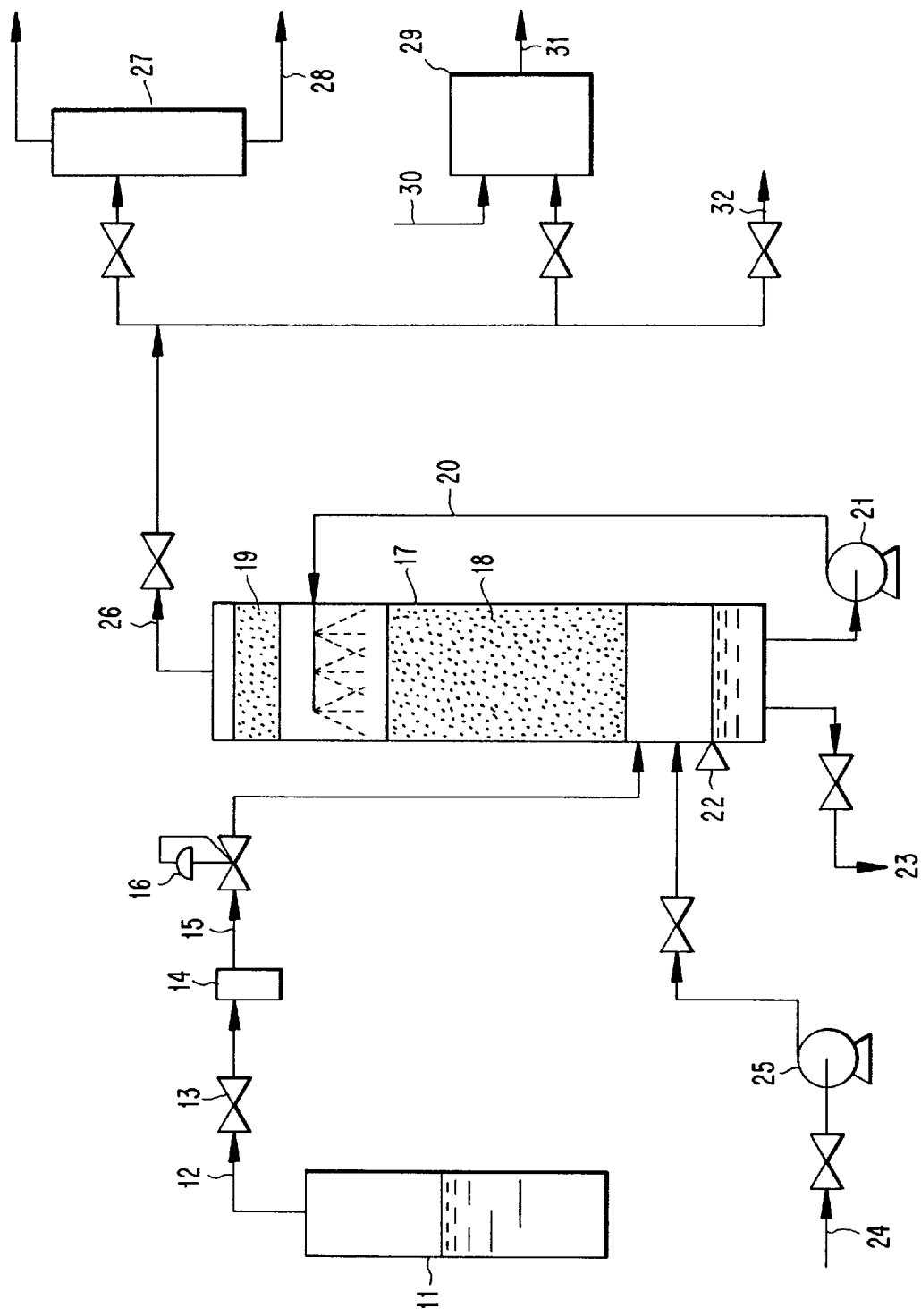
FIG. 1 is an engineering flow diagram of one example of a unit for the production of ultrapure hydrochloric acid.
Figure 2:
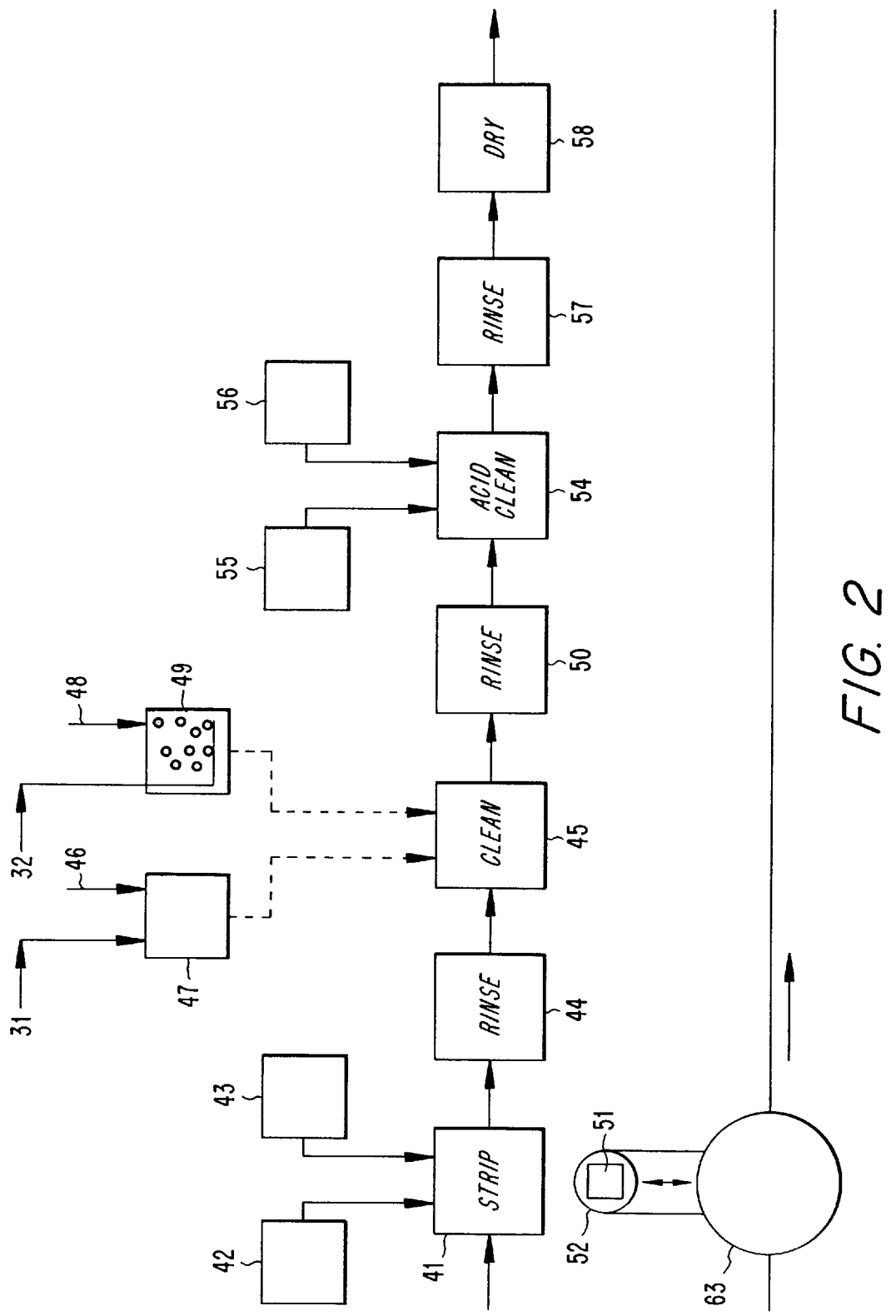
FIG. 2 is a block diagram of a semiconductor fabrication line in which the purification unit of FIG. 1 may be incorporated.

The numerous innovative teachings of the present application will be described with particular reference to the presently preferred embodiment (by way of example, and not of limitation), in which:

Purification of HCl

In accordance with this invention, vapor-phase HCl is first drawn from the vapor space in a liquid HCl supply reservoir. Drawing vapor in this manner serves as a single-stage distillation, leaving certain solid and high-boiling impurities behind in the liquid phase. The supply reservoir can be any conventional supply tank or other reservoir suitable for containing HCl, and the HCl can be in anhydrous form or an aqueous solution (preferably anhydrous). The reservoir can be maintained at atmospheric pressure or at a pressure above atmospheric i-F desired to enhance the flow of the HCl through the system. The reservoir is preferably heat controlled, so that the temperature is within the range of from about 10° to about 50° C., preferably from about 15° to about 35° C., and most preferably from about 20° to about 25° C.

Impurities that will be removed as a result of drawing the HCl from the vapor phase include metals of Groups I and II of the Periodic Table, as well as complexed forms of these metals which may form as a result of the contact with HCl. Also rejected will be oxides and carbonates of these metals, as well as hydrides such as beryllium hydride and magnesium hydride; Group III elements and their oxides, as well as adducts of hydrides and halides of these elements; transition metal hydrides; and heavy hydrocarbons and halocarbons such as pump oil.

The HCl drawn from the reservoir is passed through a filtration unit to remove any solid matter entrained with the vapor. Microfiltration and ultrafiltration units and membranes are commercially available and can be used. The grade and type of filter will be selected according to need. The presently preferred embodiment uses a gross filter, followed by a 0.1 micron filter, in front of the ionic purifier, and no filtration after the ionic purifier.

The filtered vapor is then passed to a scrubber in which the vapor is scrubbed with low-pH purified (preferably deionized) water. The low-pH water is preferably an aqueous HCl solution, with the concentration raised to saturation by recycling through the scrubber. The scrubber may be conveniently operated as a conventional scrubbing column in countercurrent fashion. Although the operating temperature is not critical, the column is preferably run at a temperature ranging from about 10° to about 50° C., preferably from about 15° to about 35° C. Likewise, the operating pressure is not critical, although preferred operation will be at a pressure of from about atmospheric pressure to about 30 psi above atmospheric. The column will typically contain a conventional column packing to provide for a high degree of contact between liquid and gas, and preferably a mist removal section as well.

In one presently preferred example, the column has a packed height of approximately 3 feet (0.9 meter) and an internal diameter of approximately 7 inches (18 cm), to achieve a packing volume of 0.84 cubic feet (24 liters), and is operated at a pressure drop of about 0.3 inches of water (0.075 kPa) and less than 10% flood, with a recirculation flow of about 2.5 gallons per minute (0.16 liter per second) nominal or 5 gallons per minute (0.32 liter per second) at 20% flood, with the gas inlet below the packing, and the liquid inlet above the packing but below the mist removal section. Preferred packing materials for a column of this description are those which have a nominal dimension of less than one-eighth of the column diameter. The mist removal section of the column will have a similar or more dense packing, and is otherwise conventional in construction. It should be understood that all descriptions and dimensions in this paragraph are examples only. Each of the system parameters may be varied.

In typical operation, startup is achieved by first saturating deionized water with HCl to form a solution for use as the starting scrubbing medium. During operation of the scrubber, a small amount of liquid in the column sump is drained periodically to remove accumulated impurities.

Examples of impurities that will be removed by the scrubber include reactive volatiles such as metal halides; halides and hydrides of phosphorus, arsenic, and antimony; transition metal halides in general; and Group III and Group VI metal halides and hydrides.

The units described up to this point may be operated in either batchwise, continuous, or semi-continuous manner. Continuous or semi-continuous operation is preferred. The volumetric processing rate of the HCl purification system is not critical and may vary widely. In most operations for which the present invention is contemplated for use, however, the flow rate of HCl through the system will be within the range of about 200 cc/h to thousands of liters per hour.

Optionally the HCl leaving the scrubber can be further purified prior to use, depending on the particular type of manufacturing process for which the HCl is being purified. For example, in some cases the inclusion of a dehydration unit and a distillation unit in the system will be beneficial. The distillation column may also be operated in either batchwise, continuous, or semi-continuous manner. In a batch operation, a typical operating pressure might be 300 pounds per square inch absolute (2,068 kPa), with a batch size of 100 pounds; (45.4 kg). The column in this example has a diameter of 8 inches (20 cm), a height of 72 inches (183 cm), operating at 30% of flood, with a vapor velocity of 0.00221 feet per second (0.00067 meter per second), a height equivalent to a theoretical plate of 1.5 inches (3.8 cm), and 48 equivalent plates. The boiler size in this example is about 18 inches (45.7 cm) in diameter and 27 inches (68.6 cm) in length, with a reflux ratio of 0.5, and recirculating chilled water enters at 60° F. (15.6° C.) and leaves at 90° F. (32.2° C.). Again, this is merely an example; distillation columns varying widely in construction and operational parameters can be used.

Depending on its use, the purified HCl, either with or without the distillation step, may be used as a purified gas or as an aqueous solution, in which case the purified HCl is dissolved in purified (preferably deionized) water. The proportions and the means of mixing are conventional.

A flow chart depicting one example of an HCl purification unit in accordance with this; invention is shown in FIG. 1. Liquid HCl is stored in a reservoir 11. HCl vapor 12 is drawn from the vapor space in the reservoir, then passed through a shutoff valve 13, then through a filter 14. The filtered HCl vapor 15, whose flow is controlled by a pressure regulator 16, is then directed to a scrubbing column 17 which contains a packed section 18 and a mist removal pad 19. Saturated aqueous HCl 20 flows downward as the HCl vapor flows upward, the liquid being circulated by a circulation pump 21, and the liquid level controlled by a level sensor 22. Waste 23 is drawn off periodically from the retained liquid in the bottom of the scrubber. Deionized water 24 is supplied to the scrubber 17, with elevated pressure maintained by a pump 25. The scrubbed HCl 26 is directed to one of three alternate routes. These are:

(1) A distillation column 27 where the HCl is purified further. The resulting distilled HCl 28 is then directed to the point of use.

(2) A dissolving unit 29 where the HCl is combined with deionized water 30 to form an aqueous solution 31, which is directed to the point of use. For plant operations; with multiple points of use, the aqueous solution can be collected in a holding tank from which the HCl is drawn into individual lines for a multitude of point-of-use destinations at the same plant.

(3) A transfer line 32 which carries the HCl in gaseous form to the point of use. The second and third of these alternatives, which do not utilize the distillation column 27, are suitable for producing HCl with less than 100 parts per trillion of any metallic impurity. For certain uses (such as some furnace cleanup uses), the inclusion of the distillation column 27 can be advantageous. In such cases the distillation column is used to remove non-condensables such as oxygen and nitrogen, that might interfere with cleanup. In addition, since the HCl leaving the scrubber 17 is saturated with water, a dehydration unit can optionally be incorporated into the system between the scrubber 17 and the distillation column 27, as an option, depending on the characteristics and efficiency of the distillation column.

With any of these alternatives, the resulting stream, be it gaseous HCl or an aqueous solution, may be divided into two or more branch streams, each directed to a different use station, the purification unit thereby supplying purified HCl to a number of use stations simultaneously.

Experimental Summary

Two separate HCl cylinders from Matheson Gas Products were used for this investigation. Differences were noted in the impurity compositions in these two cylinders and are probably indicative of variability in HCl sources in general. The purpose of this investigation was to develop purification methods for virtually any feed rather than optimize a process for a particular batch.

The entire experimental sequence was carried out in a hood in a ventilated but otherwise uncontrolled atmosphere room. The floor was untreated concrete, thus there is a strong possibility that Ca, K, and Na results are higher than would be obtained in an actual point-of-use system with ambient control.

The sampling apparatus was constructed from a CGA to ¼" tube adapter and a Nupro bellows sealed valve with ¼" tube fittings, both stainless steel. The outlet of the valve was fitted with a short piece of ¼" Teflon tubing so that the liquid or vapor could be conducted directly to the sample bottle. In this manner the aqueous HCl sample could be prepared directly in the sample bottle, obviating the need for liquid transfers in an uncontrolled environment.

Sample bottles were prepared by thoroughly DI rinsing and discarding the rinse four times before adding approximately 100 cc of DI and capping the bottles. Samples were taken by bubbling the HCl from the selected source and method into the DI previously added to the sample bottle. In most cases HCl addition was continued until the solution in the sample bottle was saturated as evidenced by the HCl passing through the solution and escaping to the hood exhaust. At saturation the sample solution was quite hot to the touch and the sample bottle partially collapsed after capping and cooling.

A simulated ionic purifier ("IP") system was prepared from 1" Teflon pipe. One side of a union was welded to a capped section of pipe approximately 1' high. The other part of the union was capped with two ¼" holes drilled through the cap. ¼" Teflon tubing was inserted into these tight fitting holes, one tube extending down to the bottom of the apparatus, the other tube was barely pushed through the top. The lower 4" of the assembly was packed with Raschig Rings cut from thin wall ¼" Teflon tubing. During experiments this simulated IP was filled with approximately 100 cc of DI. By passing HCl gas through the bottom tube, a gas/liquid interface could be achieved. While this assembly is not nearly as effective as a well designed IP with a packed tower, a worst case IP performance could be estimated. The bottom sample from this IP required increased handling to transfer the bottom sample to a sample bottle for lab submission. For this reason the IP bottom samples may measure higher in ambient borne contamination.

The HCl liquid from each cylinder was sampled by inverting the cylinder and draining liquid into the previously prepared sample container. The impurities measured are truly worst case as the liquid withdrawal technique would tend to also sample dense particles and the extra handling would expose the sample to room air for a longer period. ICP results for liquid withdrawal for both cylinders are shown in Table 1. The results have been normalized to 37.25% HCl, the nominal spec for aqueous HCl from the HCl point-of-use system. The significant excess of Fe and the other contaminants precluded more sensitive ICP/MS testing, thus the actual levels of less prominent contaminants are not known. However, as long as these impurities can be reduced to acceptable levels in the product, the exact level is only of technological interest. Fortunately all of these impurities can be removed by distillation and/or IP techniques.

The following elements were found in one or both of the cylinders analyzed: Al, B, Ba, Cr, Cu, Fe, K, and Na. The contamination levels and removal techniques will be discussed in subsequent sections.

A number of experimental runs have been performed to verify this purification concept for the HCl case. For brevity and clarity similar experiments are described in groups.

Liquid Anhydrous HCl Measurements

The anhydrous liquid was measured by inversion of the cylinder and absorbing the anhydrous liquid HCl directly into water. This represents a worst case as solid impurities are also likely to be directed into the solvent. The samples were then sent for ICP analysis for metals. (Cylinder 1: sample # 062993602, Cylinder 2: sample # 062993605).

Vapor Anhydrous HCl Measurements

In these experiments the cylinders were supported with the outlet at the top. Anhydrous vapor was distilled from the liquid and dissolved in a small sample of ultrapure water by means of a sparger tube. This method represents a traditional single stage distillation. These data were used for comparison with the purifier experiments. (Cylinder 1: sample # 071293601, cylinder 2: sample # 062993603)

Ionic Purifier Measurements

These bench experiments were carried out with the previously described apparatus After filling the simulated purifier with ultrapure water and directing the output of the purifier to another portion of ultrapure water the HCl gas was slowly admitted to the experimental train. With considerable heating HCl would be absorbed into the first stage purifier until heating and the increased concentration in the purifier would achieve the boiling point for the system. At this point HCl gas would no longer be absorbed in the purifier but would bubble through the liquid following the tortuous path provided by the Raschig ring packing. In this way the vapor was "scrubbed" by the aqueous media. The metallic impurities having a stronger affinity for the aqueous solution than the vapor state would remain behind in the liquid phase. The purified gas was then absorbed at the next stage to form hydrochloric acid. Both the liquid left behind in the purifier ("bottom" sample) and the "scrubbed" product sample ("product") were then sent for analysis with the ICP/MS method. Both cylinders were run in several experiments each, and are tabulated in the remainder of Table 1.

Experimental Summary

Comparing the liquid from each cylinder with the vapor distilled from over this liquid demonstrate the purification available with simple distillation (Cyl 1 liquid vs Cyl 1 vapor, Cyl 2 liquid vs Cyl 2 vapor) and shows a good purification with separation factors of 10 to 5000. But many species were still above the 1 ppb level. Adding successive or multistage distillation capability while capable of further upgrading the purity, would result in significantly increased cost and complexity. However, the product output of the purifier demonstrated significantly reduced impurity levels over that of the simple distillation case. Additionally, the bottom sample from any run was significantly higher for any particular element than the product stream demonstrating the separation efficiency of this technique. The purifier is much simpler and economical to construct and operate than a multistage distillation system.

CYLINDER-2 IP SIMULATION - I

Experimental work: Opened tank valve, no leaks. Opened sample valve, too far, massive bubbling and liquid carry over to waste. Shut sample valve back too far, some suck back. Reopened at a reasonable rate. Wasted HCl gas for several seconds before injecting into DI. DI sample remained clear, IP bottom became quite yellow. Withdrew sample inject tube, capped HClS product sample. Removed sample tube to IP from sample valve, shut sample valve. Poured IP bottom sample into sample container.

Sample #: IP Bottom 063093501, HClS Product 063093502

CYLINDER-1 IP SIMULATION

Experimental work: Opened valves to achieve good HCl flow to IP. When saturated, HCl gas passed through the IP. After several seconds to achieve line cleaning, product line introduced to sample bottle. Product line removed after sample saturated. Observed that the leak originated from the relief port in the valve, previous suck backs and rinsing must have corroded a hole in the bellows seal. Recovered sample from IP reservoir.

Sample #: IP Product 071293603, IP Bottom 071293602

CYLINDER-2 IP TEST

Experimental work: Same set up and procedure as previous test but without $(NH_4)_2S$.

Sample #: IP Bottom 071493603, IP Product 071493604

Table of Sample Analyses

The following three-part table shows test results on the various samples referred to above:

HCl BENCH TEST RESULTS:

| Lot # | 062993602 | 062993603 | 062993605 | 063093601 | 063093602 |
|---|---|---|---|---|---|
| Id: | 93-7239 | 93-07240 | 93-07242 | 93-07338 | 93-07339 |
| Sample | Cyl 1 liq | Cyl 2 Vap | Cyl 2 liq | Cyl 2 IP Bot | Cyl 2 IP Prod |
| Assay | 6.10 | 17.31 | 6.80 | 34.55 | 15.34 |
| Ag |  | <2.15 |  |  |  |
| Al | <136.18 | 16.89 | 164.34 | 191.91 | <54.15 |
| Au |  | <2.15 |  | <24.04 | <54.15 |
| B | 2070.12 | 4.41 | 745.00 | 410.77 | <27.20 |
| Ba | 36.64 | <2.15 | <12.60 | <2.48 | <5.59 |
| Be | <1.83 | <0.65 | <1.64 | <0.32 | <0.73 |
| Bi | <678.44 | <2.15 | <608.60 | < | <269.78 |
| Ca | <7.33 | <2.58 | 8.44 | <1.29 | < |
| Cd | <14.05 | <2.15 | <12.60 | < | <5.59 |
| Co | <136.18 | <2.15 | <122.16 | < | <54.15 |
| Cr | 775.53 | <24.10 | <61.35 | 27276.06 | <27.20 |
| Cu | 1337.34 | 2.71 | <61.35 | 354.71 | <27.20 |
| Fe | 144225 | 29.22 | 129696 | 84865.31 | <27.20 |
| Ga | <678.44 | <239.08 | <608.60 |  | <269.78 |
| Ge | <678.44 | <239.08 | <608.60 | <119.78 |  |
| In |  | <2.15 |  |  |  |
| K | <1801.43 | 2.39 | 3.62 |  |  |
| La |  | <2.15 |  |  |  |
| Li | <14.05 | <2.15 | <12.60 | <2.48 | <5.59 |
| Mg | <1.83 | <0.65 | <1.64 | <0.32 | <0.73 |
| Mn | <14.05 | <4.95 | <12.60 | 2043.09 | <5.59 |
| Mo | <183.20 | 2.71 | <61.35 | 414.01 | <27.20 |
| Na | 293.11 | 0.97 | <0.55 | <47.98 | <108.06 |
| Ni | <271.74 | <95.76 | <243.77 | 14402.97 | <108.06 |
| P | <136.18 | <47.99 | <122.16 | <24.04 | <54.15 |
| Pb |  | <2.15 |  |  |  |
| Pd | <678.44 | <2.15 | <608.60 | <119.78 | <269.78 |
| Pt | <678.44 | <2.15 | <608.60 | <119.78 | <269.78 |
| Sb | <678.44 | <2.15 | <608.60 | <119.78 | <269.78 |
| Sn | <339.52 | <2.15 | <304.57 | <59.95 | <135.01 |
| Sr | <68.39 | <2.15 | <61.35 | <12.08 | <27.20 |
| Ta | <678.44 | <2.15 | <608.60 | <119.78 |  |
| Ti | <136.18 | <47.99 | <122.16 | <24.04 | <54.15 |
| Tl |  | <2.15 |  |  |  |
| V | <68.39 | <24.10 | <61.35 | <12.08 | <27.20 |
| W |  | <2.15 |  |  |  |
| Zn | <68.39 | <24.10 | <61.35 | 152.02 | <27.20 |
| Zr | <189.30 | <2.15 | <122.16 | <24.04 | <54.15 |

| Lot # | 070193601 | 070193602 | 071293601 |
|---|---|---|---|
| Id | 93-07388 | 93-07389 | 93-07890 |
| Sample | Cyl 2 IP Bot | Cyl 2 IP Prod | Cyl 1 Vap |
| Assay | 33.92 | 14.42 | 18.49 |
| Ag | 0.00 | <2.58 | <44.93 |
| Al | <24.49 | 2.40 |  |
| Au | 0.00 | <2.58 |  |
| B | <12.30 | 3.93 | <22.56 |
| Ba | <2.53 | <2.58 | 8.06 |
| Be | <0.33 | <2.58 | <0.60 |

-continued

| | | | |
|---|---|---|---|
| Bi | <122.01 | <2.58 | <223.82 |
| Ca | 0.00 | <3.10 | <2.42 |
| Cd | <2.53 | <2.58 | <2.62 |
| Co | <24.49 | <2.58 | <44.93 |
| Cr | <12.30 | <2.58 | <22.56 |
| Cu | <12.30 | <2.58 | <22.56 |
| Fe | 124.09 | 3.69 | <22.56 |
| Ga | <122.01 | <0.00 | <223.82 |
| Ge | 0.00 | <0.00 | <223.82 |
| In | 0.00 | <2.58 | |
| K | 0.00 | 7.17 | |
| La | 0.00 | <2.58 | |
| Li | <2.53 | <2.58 | <4.63 |
| Mg | <0.33 | <2.58 | <0.60 |
| Mn | 91.15 | 0.00 | <4.63 |
| Mo | <12.30 | <2.58 | <22.56 |
| Na | <48.87 | 11.47 | <89.65 |
| Ni | <48.87 | 0.00 | <89.65 |
| P | <24.49 | 0.00 | <44.93 |
| Pb | 0.00 | <2.58 | |
| Pd | <122.01 | <2.58 | <223.82 |
| Pt | <122.01 | <2.58 | <223.82 |
| Sb | <122.01 | <2.58 | <223.82 |
| Sn | <61.06 | <2.58 | <112.01 |
| Sr | <12.30 | <2.58 | <22.56 |
| Ta | 0.00 | <2.58 | <223.82 |
| Ti | <24.49 | 0.00 | <44.93 |
| Tl | 0.00 | <2.58 | |
| V | <1#2.30 | 0.00 | <22.56 |
| W | 0.00 | <2.58 | |
| Zn | <12.30 | 0.00 | <22.56 |
| Zr | <24.49 | <2.58 | <44.93 |

| Lot # | 071293602 | 071293603 | 071493603 | 071493604 |
|---|---|---|---|---|
| Id | 93-07891 | 93-07892 | 93-07974 | 93-07975 |
| Sample | Cyl 1 IP Bot | Cyl 1 IP Prod | Cyl 1 IP Bot | Cyl 1 IP Prod |
| Assay | 33.33 | 16.67 | 35.08 | 14.49 |
| Ag | <24.92 | <49.83 | 7.33 | <2.57 |
| Al | 0.00 | 0.00 | 3.57 | 0.67 |
| Au | 0.00 | 0.00 | <1.06 | <2.57 |
| B | <12.52 | <25.03 | 19.64 | <2.57 |
| Ba | 5.59 | <5.14 | <1.06 | <2.57 |
| Be | <0.34 | <0.67 | <1.06 | <2.57 |
| Bi | <124.17 | <248.26 | <1.06 | <2.57 |
| Ca | <1.34 | <2.68 | 19.76 | 1.90 |
| Cd | <1.45 | <2.90 | <1.06 | <2.57 |
| Co | <24.92 | <49.83 | 2.34 | <2.57 |
| Cr | <12.52 | <25.03 | 0.00 | 0.00 |
| Cu | <12.52 | <25.03 | 21.02 | <2.57 |
| Fe | 62.59 | <25.03 | 0.00 | 1.75 |
| Ga | <124.17 | <248.26 | 0.00 | 0.00 |
| Ge | <124.17 | <248.26 | 0.00 | 0.00 |
| In | 0.00 | 0.00 | <1.06 | <2.57 |
| K | 0.00 | 0.00 | 0.00 | 2.08 |
| La | 0.00 | 0.00 | <1.06 | <2.57 |
| Li | <2.57 | <5.14 | <1.06 | <2.57 |
| Mg | <0.34 | <0.67 | 11.79 | <2.57 |
| Mn | <2.57 | <5.14 | 0.00 | 0.00 |
| Mo | <12.52 | <25.03 | 29.63 | <2.57 |
| Na | <49.73 | <99.44 | 1.71 | 4.19 |
| Ni | <49.73 | <99.44 | 0.00 | 0.00 |
| P | <24.92 | <49.83 | 0.00 | 0.00 |
| Pb | 0.00 | 0.00 | <1.06 | <2.57 |
| Pd | <124.17 | <248.26 | <1.06 | <2.57 |
| Pt | <124.17 | <248.26 | <1.06 | <2.57 |
| Sb | <124.17 | <248.26 | <1.06 | <2.57 |
| Sn | <62.14 | <124.24 | <1.06 | <2.57 |
| Sr | <12.52 | <25.03 | <1.06 | <2.57 |
| Ta | <124.17 | <248.26 | <1.06 | <2.57 |
| Ti | <24.92 | <49.83 | 0.00 | 0.00 |
| Tl | 0.00 | 0.00 | <1.06 | <2.57 |
| V | <12.52 | <25.03 | 0.00 | 0.00 |
| W | 0.00 | 0.00 | <1.06 | <2.57 |
| Zn | 40.23 | <25.03 | 0.00 | 0.00 |
| Zr | <24.92 | <49.83 | <1.06 | <2.57 |

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, the disclosed innovative techniques are not strictly limited to manufacture of integrated circuits, but can also be applied to manufacturing discrete semiconductor components, such as optoelectronic and power devices.

For another example, the disclosed innovative techniques can also be adapted to manufacture of other technologies where integrated circuit manufacturing methods have been adopted, such as in thin-film magnetic heads and active-matrix liquid-crystal displays; but the primary application is in integrated circuit manufacturing, and applications of the disclosed techniques to other areas are secondary.

For another example, it is not strictly necessary to use a scrubber to perform the liquid-vapor contact; a bubbler could be used instead, although this is much less desirable because of the less efficient gas/liquid contact.

Optionally other filtration or filtration stages can be combined with the disclosed purification apparatus.

It should also be noted that additives can be introduced into the purification water if desired, although this is not done in the presently preferred embodiment.

As noted above, the primary embodiment is an on-site purification system. Alternatively, in a less preferred class of embodiment, the disclosed purification system can also be adapted to operate as a part of a manufacturing unit to produce ultra-high-purity chemicals for shipment; however, this alternative embodiment does not provide the advantages of on-site purification as discussed above. Such applications encounter the inherent risks of handling ultra-high-purity chemicals, as discussed above; but for customers who require packaged chemicals (with the attendant handling), the disclosed innovations at least give a way to achieve an initial purity which is higher than that available by other techniques. Again, in such applications a dryer stage may also be used after the ionic purifier.

As noted above, the primary embodiment is directed to providing ultrapure aqueous chemicals, which are most critical for semiconductor manufacturing. However, the disclosed system and method embodiments can also be used for supply of purified gas streams. (In many cases, use of a dryer downstream from the purifier will be useful for this.)

It should also be noted that piping for ultrapure chemical routing in semiconductor front ends may include in-line or pressure reservoirs. Thus references to "direct" piping in the claims do not preclude use of such reservoirs, but do preclude exposure to uncontrolled atmospheres.

What is claimed is:

1. A method for supplying a high-purity HCl reagent to a workstation in a production line for the manufacture of a high-precision electronic component, said method comprising:
    (a) drawing HCl gas from a vapor space above liquid HCl in an HCl-containing reservoir;
    (b) passing said HCl gas through a filtration membrane for removing particles greater than 0.005 micron therefrom;
    (c) passing said HCl gas thus filtered through a scrubber whereby said HCl gas is contacted with an aqueous solution of HCl in deionized water; and
    (d) recovering said HCl gas emerging from said scrubber and directing said HCl gas to said workstation.

2. A method in accordance with claim 1 further comprising dissolving said HCl gas emerging from said scrubber in purified water prior to directing said HCl gas to said workstation.

3. A method in accordance with claim 1 further comprising passing said HCl gas through a distillation column for further purification prior to directing said HCl gas to said workstation.

4. A method in accordance with claim 1 further comprising
    passing said HCl gas from said scrubber through a distillation column for further purification, and dissolving said HCl gas emerging from said distillation column in purified water prior to directing said HCl gas to said workstation.

5. A method in accordance with claim 4 in which steps (b) and (b') are conducted at a temperature ranging from about 15° to about 35° C.

6. A method in accordance with claim 4 in which steps (b) and (b') are conducted at a temperature ranging from about 15° to about 35° C. and at a pressure of from about atmospheric pressure to about 30 psi above atmospheric pressure.

7. A method in accordance with claim 1 in which step (b) is conducted at a temperature ranging from about 10° to about 50° C.

8. A method in accordance with claim 7 in which step (b) is conducted at a temperature ranging from about 15° to about 35° C.

9. A method in accordance with claim 1 in which step (b) is conducted at a temperature ranging from about 15° to about 35° C. and at a pressure of from about atmospheric pressure to about 30 psi above atmospheric pressure.

10. A method for the preparation of ultra-high-purity HCl, said method comprising:
    (a) drawing HCl gas from a vapor space above liquid HCl in an HCl-containing reservoir;
    (b) passing said HCl gas through a unit whereby said HCl gas is contacted with an aqueous solution of HCl in deionized water; and
    (c) recovering a purified HCl gas emerging from said unit.

11. An on-site subsystem, in a semiconductor device fabrication facility, for providing ultra-high-purity reagents comprising HCl to a semiconductor manufacturing operation, comprising:
    an evaporation source connected to receive a liquid HCl source and to provide a flow of HCl vapor therefrom;
    said flow of HCl vapor being connected to pass through an ionic purifier unit which provides a recirculating volume of high-purity-water, containing a high concentration of hydrochloric acid, in contact with said flow of HCl vapor;
    a generator unit, connected to receive said flow of HCl vapor from said purifier unit and to combine said HCl vapor with an aqueous liquid to produce an ultra-pure aqueous solution comprising HCl; and
    a piping connection which routes said aqueous solution to one or more points of use in the semiconductor device fabrication facility.

12. The system of claim 11, further comprising a particulate filter interposed between said evaporation source and said purifier unit.

13. The system of claim 11, wherein said liquid HCl source consists of anhydrous HCl.

14. The system of claim 11, wherein said recirculating volume of high-purity water does not contain any additives.

15. The system of claim 11, wherein said liquid HCl source is of standard commercial-grade purity.

16. The system of claim 11, wherein said evaporator is a bulk storage tank.

17. The system of claim 11, wherein said evaporator operates at a controlled temperature, and is connected to receive liquid HCl from a bulk storage tank.

18. An on-site subsystem, in a semiconductor device fabrication facility, for providing ultra-high-purity reagents comprising HCl to a semiconductor manufacturing operation, comprising:

an evaporation source connected to receive a liquid HCl source and to provide a flow of HCl vapor therefrom;

said flow of HCl vapor being connected to pass through an ionic purifier unit which provides a recirculating volume of high-purity water, containing a high concentration of hydrochloric acid, in contact with said flow of HCl vapor; and a generator unit, connected to receive said flow of HCl vapor from said purifier and to combine said HCl vapor with an aqueous liquid to produce an ultra-pure aqueous solution comprising HCl;

whereby said ultra-pure aqueous solution can be used within the semiconductor device fabrication facility without bulk transfer or exposure of liquid surface to ambient.

19. The system of claim 8, further comprising a particulate filter interposed between said evaporation source and said purifier unit.

20. The system of claim 18, wherein said liquid HCl source consists of anhydrous HCl.

21. The system of claim 18, wherein said recirculating volume of high-purity water does not contain any additives.

22. The system of claim 18, wherein said liquid HCl source is of standard commercial-grade purity.

23. The system of claim 18, wherein said evaporator is a bulk storage tank.

24. The system of claim 18, wherein said evaporator operates at a controlled temperature, and is connected to receive liquid HCl from a bulk storage tank.

25. An on-site subsystem, in a, semiconductor device fabrication facility, for providing ultra-high-purity HCl for use in semiconductor manufacturing operations at said facility, comprising:

an evaporation source connected to receive a liquid HCl and to provide a flow of HCl vapor therefrom;

said flow of HCl vapor being connected to pass through an ionic purifier unit which provides a recirculating volume of high-purity water, containing a high concentration of hydrochloric acid, in contact with said flow of HCl vapor; and a dryer unit, connected to receive said flow of HCl vapor from said purifier unit and to dry said HCl vapor; and a piping connection which routes said vapor from said dryer unit to one or more points of use in the semiconductor device fabrication facility.

26. The system of claim 25, further comprising a particulate filter interposed between said evaporation source and said purifier unit.

27. The system of claim 25, wherein said liquid HCl source consists of anhydrous HCl.

28. The system of claim 25, wherein said recirculating volume of high-purity water does not contain any additives.

29. The system of claim 25, wherein said liquid HCl source is of standard commercial-grade purity.

30. The system of claim 25, wherein said evaporator is a bulk storage tank.

31. The system of claim 25, wherein said evaporator operates at a controlled temperature, and is connected to receive liquid HCl from a bulk storage tank.

32. A system for the preparation of ultra-high purity HCl, said system comprising:

(a) a reservoir of liquid HCl with a vapor space above said liquid;

(b) a connection for drawing vapor containing HCl gas from said vapor space;

(c) a filtration membrane adapted to remove particles from vapor thus drawn; and (d) a gas-liquid interface chamber in which filtered vapor having passed through said filtration membrane is contacted with an aqueous solution of HCl in deionized water, to produce purified HCl gas.

33. A system in accordance with claim 32, further comprising a distillation column arranged to distill the purified HCl gas emerging from said gas-liquid interface chamber.

34. A system for manufacture of high-precision electronic components, said system comprising:

(a) a production line containing a plurality of workstations arranged to perform various respective steps, on wafers containing semiconductor material, in manufacture of an electronic component, at least one of said workstations using gaseous HCl as a source gas for operation on to said workpiece; and (b) a purification subunit connected to said at least one of said workstations by piping to supply said gaseous HCl in ultra-high purity form, said subunit comprising:

(i) a reservoir of liquid HCl with a vapor space above said liquid HCl;

(ii) a connection for drawing vapor containing HCl gas from said vapor space;

(iii) a filtration membrane for removing particles from the vapor thus drawn; and (iv) a scrubber arranged to contact filtered vapor having passed through said filtration membrane with an aqueous solution of HCl in deionized water, the vapor thus scrubbed being purified HCl gas;

(c) said purification unit being connected to said workstations by piping, to supply said HCl in ultra-high purity form.

35. A system in accordance with claim 34 in which said subunit further comprises a distillation column arranged to distill vapor emerging from said scrubber.

36. A system in accordance with claim 34 in which said subunit further comprises means for combining said purified HCl gas with purified water to form an aqueous HCl solution.

37. A system in accordance with claim 34 in which HCl purified by said subunit leaves said subunit at a location positioned within approximately 30 cm of a means for applying the product of step (b) directly to said workpiece.

38. A system in accordance with claim 34 in which said subunit is sized to produce said purified HCl gas at a rate of from about 2 l/h to about 200 l/h.

39. A system in accordance with claim 34 in which components (ii), (iii), and (iv) of said subunit are arranged for continuous or semi-continuous flow.

40. A system for the preparation of ultra-high-purity HCl, comprising:

an evaporation source connected to receive a liquid HCl source and to provide a flow of HCl vapor therefrom;

said flow of HCl vapor being connected to pass through a unit which provides a recirculating volume of high-purity water, containing a high concentration of hydrochloric acid, in contact with said flow of HCl vapor, to produce a purified HCl gas;

said unit having an outlet for removing said purified HCl gas emerging from said unit.

* * * * *